Feb. 10, 1970 ICHIRO SHIMANO 3,495,105

THREE-TERMINAL PIEZOELECTRIC RESONATOR

Filed June 17, 1968

INVENTOR
ICHIRO SHIMANO

BY Stevens, Davis, Miller & Mosher

ATTORNEYS 3,495,105

THREE-TERMINAL PIEZOELECTRIC RESONATOR

Ichiro Shimano, Nagoya, Japan, assignor to NGK Spark Plug Co., Ltd., Nagoya, Japan Filed June 17, 1968, Ser. No. 737,452
Claims priority, application Japan, July 19, 1967, 42/46,449
Int. Cl. H01v *7/00;* H03h *9/00*
U.S. Cl. 310—9.8 2 Claims

ABSTRACT OF THE DISCLOSURE

This resonator comprises a filter element made of piezoelectric ceramics and including a dot-electrode, an outer electrode surrounding said dot-electrode and an overall electrode. The input and output terminals to be connected with the dot-electrode and outer electrode, respectively, are connected with those portions of the dot-electrode and outer electrode which are located near each other and across a vibrating node of the fundamental frequency of the filter element to provide a three-terminal piezoelectric resonator which is capable of vibrating with the fundamental frequency and is small in size.

The present invention relates to a three-terminal piezoelectric resonator comprising a filter element made of lead-zirconate-titanate ceramics.

Such kind of three-terminal piezoelectric resonator has widely been used in practice as an intermediate frequency filter for use in radio and television receivers.

A conventional three-terminal piezoelectric resonator shown in FIGS. 1 and 2 comprises a disc-shaped filter element 1 which may, if desired, be formed into a square plate. The filter element 1 is made of piezoelectric ceramics and provided at one of its principal surfaces with a dot-electrode 2 and an outer electrode 3 concentrically disposed about the dot-electrode 2 and spaced therefrom and at another opposite principal surface with an overall electrode 4 covering substantially all of the another principal surface. These electrodes 2, 3 and 4 may be deposited on the surface of the filter element 1 by means of a conventional technique such as a silver coating method. An input lead wire 5, output lead wire 6 and earth lead wire 7 are connected with the dot-electrode 2, outer electrode 3 and overall electrode 4, respectively, after the filter element 1 has been polarized by applying a direct current high voltage. The three-terminal piezoelectric resonator thus obtained is adapted to vibrate with a fundamental frequency *a* and a first overtone frequency *b* as shown by dotted line in FIG. 2 and also with the other overtone frequencies such as the second, third, fourth order, etc. (not shown). Selectivity of the fundamental frequency *a* is not different from that of the first overtone frequency *b*. The use of the fundamental frequency with a defined center frequency renders it possible to reduce the outer diameter of the filter element 1 about $\frac{1}{25}$ that of the filter element 1 which is adapted to vibrate with the first overtone frequency.

But, as a result of the fundamental frequency vibration has a node located at one point near the geometric center of the filter element 1, the practical use of the fundamental frequency vibration becomes difficult. If it is obliged to mechanically hold the dot-electrode 2, outer electrode 3 and overall electrode 4 in stationary state by means of the input, output and earth terminals, such conventional resonator has the disadvantage that there occurs hump and ripple of a main response and increase of the spurious response, thus making the practical application thereof difficult. This is the reason why the conventional three-terminal piezoelectric resonator has made use of the first overtone frequency having three nodes one located at near the center of the filter element and the other two located at the two diametrically opposite center portions of the outer electrode, respectively.

The principal object of the invention is to provide a three-terminal piezoelectric resonator which is capable of utilizing a fundamental frequency and which is considerably small in size.

For a better understanding of the invention, reference is taken to the accompanying drawing, of which:

Figure 1:
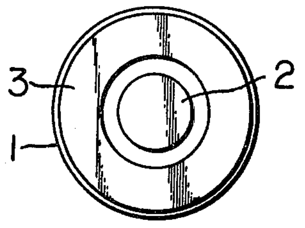
FIG. 1 is a plan view showing a conventional three-terminal piezoelectric resonator.
Figure 2:
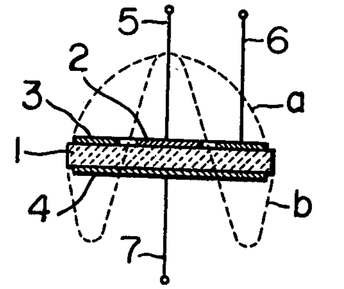
FIG. 2 is a longitudinal sectional view of FIG. 1 illustrating stress distribution curves of the fundamental frequency and first overtone frequency.
Figure 3:
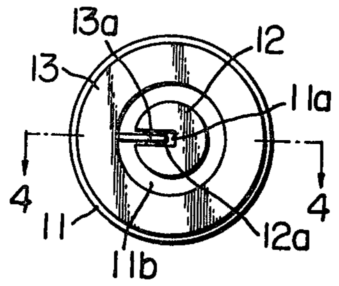
FIG. 3 is a plan view showing an embodiment of a three-terminal piezoelectric resonator according to the invention.
Figure 4:
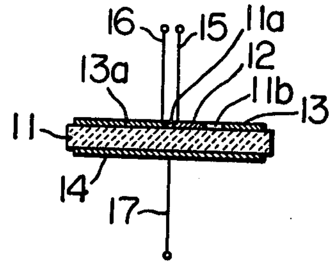
FIG. 4 is a section on line 4—4 of FIG. 3.

Referring now to FIGS. 3 and 4 showing an embodiment of a three-terminal piezoelectric resonator according to the invention, 11 represents a filter element made of lead-zirconate-titanate ceramics and provided at one of its principal surfaces with a dot-electrode 12 and an outer electrode 13 concentrically disposed about the dot-electrode 12 and spaced therefrom to form a non-metallic surface 11*b* and provided at the other principal surface with an overall electrode 14 covering substantially all of the other principal surface. These electrodes are deposited on the principal surfaces of the filter element 11 by means of a conventional technique such as silver coating method and then the filter element is polarized by applying a direct current high voltage thus obtaining three-terminal piezoelectric resonator having a piezoelectric property.

In accordance with the invention, the dot-electrode 12 is provided with an elongate groove 12*a* extending inwardly from the outer periphery of the dot-electrode 12 towards a center 11*a* corresponding to a node of the fundamental frequency vibration, while the outer electrode 13 is provided with an elongate projection 13*a* extending inwardly from the inner periphery of the outer electrode 13 across the nonmetallic surface 11*b* into the groove 12*a* and spaced from the latter. A pair of input and output lead wires 15 and 16 are connected with opposed inner ends of the groove 12*a* of the dot-electrode 12 and projecting end of the projection 13*a* of the outer electrode 13, respectievly, while an earth lead wire 17 is connected with the center of the overall electrode 14, thus providing a three-terminal piezoelectric resonator.

The node of the fundamental frequency is accurately located at the above mentioned center 11*a* so that it is preferable to extend the groove 12*a* of the dot-electrode 12 over a distance which is a little over the center 11*a* and extend the elongate projection 13*a* of the outer electrode 13 over a distance which is a little short from the center 11*a* such that the ends of the groove 12*a* and elongate projection 13*a* terminate at diametrically opposite point across the center 11*a* and also provide contacts of the input and output lead wires 15 and 16 near the center 11*a*. But, the fundamental frequency traces a smooth arcuate line at the center 11*a* so that certain displacement of the above mentioned ends of the groove 12*a* and elongate projection 13*a* is permitted and hence these ends may be terminated at opposite points somewhat displaced from the center 11*a* in dependence with associated apparatus such as apparatus for deriving the lead wires.

As explained hereinbefore, the three-terminal piezoelectric resonator according to the invention comprises a filter element including at near those portions of one of the principal surfaces which correspond to the node of vibration an input lead wire for the dot-electrode and an output lead wire for the outer electrode insulated one from the other and hence is capable of utilizing the fundamental frequency and further provides the important advantage that bad influences such as occurrence of hump and ripple of the main response and spurious response can be avoided, and that the outer diameter of the filter element can be reduced to about 1/25 that of the conventional filter element which makes use of the first overtone frequency.

Figure 5:
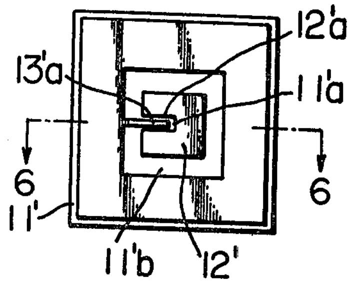
FIG. 5 is a plan view showing another embodiment of a three-terminal piezoelectric resonator according to the invention.
Figure 6:
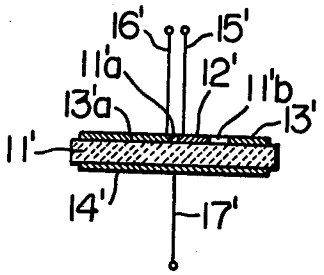
FIG. 6 is a section on line 6—6 of FIG. 5.

While the invention has been applied to a disc-shaped three-terminal piezoelectric resonator for the purpose of illustration, the invention may also be applied to a square plate-shaped three-terminal piezoelectric resonator as shown in FIGS. 5 and 6 with the same advantageous effect.

In FIGS. 5 and 6, 11'–17' designate parts corresponding to those parts which are shown by 11–17 in FIGS. 3–4.

In the embodiment shown in FIGS. 3 and 4 the input lead wire 15, output lead wire 16 and earth lead wire 17 are directly connected to the surface of the electrodes 12, 13 and 14, respectievly, with the aid of soldering method or electric conductive cement, but these lead wires may be connected through terminal plates made of a resilient metal and having small contacts to the surface of the electrodes.

What is claimed is:

1. A three-terminal piezoelectric resonator comprising a filter element made of piezoelectric ceramics and including at one of its principal surfaces a dot-electrode and an outer electrode concentrically disposed about said dot-electrode and spaced therefrom to form a non-metallic surface therebetween and at another principal surface an overall electrode covering substantially total surface of said another principal surface, said dot-electrode including an elongate groove extending inwardly from the outer periphery of said dot-electrode into a vibrating node located at substantially center of said filter element, said outer electrode including an elongate projection extending inwardly from the inner periphery of said outer electrode through said non-metallic surface into a portion near the bottom end of said groove, and input, output and earth terminals each having a contact, said contacts of the input and output terminals being connected with portions near the ends of said groove of the dot-electrode and said projection of the outer electrode, said contact of the earth terminal being connected with the overall electrode.

2. A three-terminal piezoelectric resonator as claimed in claim 1 wherein said contacts of the input, output and earth terminals are connected with said electrodes will the aid of a soldering method or an electric conductive cement.

References Cited

UNITED STATES PATENTS

| | | | |
|---|---|---|---|
| 3,018,451 | 1/1962 | Mattiat | 310—9.8 |
| 3,074,034 | 1/1963 | Crownover | 310—9.8 |
| 3,201,621 | 8/1965 | Milner | 310—9.8 |
| 3,252,017 | 5/1966 | Bartels | 310—9.8 |
| 3,374,367 | 3/1968 | Cowan | 310—9.7 |
| 3,382,381 | 5/1968 | Horton | 310—9.7 |
| 3,396,327 | 8/1968 | Nakazawa | 310—9.8 |
| 3,431,392 | 3/1969 | Garland | 310—8.9 |

J. D. MILLER, Primary Examiner

U.S. Cl. X.R.

310—9.5, 9.7; 333—72